US007518130B2

(12) United States Patent
Chen et al.

(10) Patent No.: US 7,518,130 B2
(45) Date of Patent: Apr. 14, 2009

(54) ION BEAM BLOCKING COMPONENT AND ION BEAM BLOCKING DEVICE HAVING THE SAME

(75) Inventors: Jui-Fang Chen, Taichung County (TW); Cheng-Hung Chang, Hsinchu (TW); Chung-Jung Chen, Hsinchu (TW); Chih-Ming Yang, Taipei County (TW); Chien-Kuo Ko, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 155 days.

(21) Appl. No.: 11/742,400

(22) Filed: Apr. 30, 2007

(65) Prior Publication Data

US 2008/0265184 A1 Oct. 30, 2008

(51) Int. Cl.
*H01J 37/317* (2006.01)
*H01J 37/08* (2006.01)

(52) U.S. Cl. .................. 250/492.21; 250/397; 250/398; 250/396 R; 250/492.1; 250/492.2; 250/492.3; 313/360.1

(58) Field of Classification Search ............ 250/492.21, 250/397, 398, 396 R, 492.1, 492.2, 492.3; 313/360.1
See application file for complete search history.

(56) References Cited

U.S. PATENT DOCUMENTS

| | | | | |
|---|---|---|---|---|
| 4,847,504 | A * | 7/1989 | Aitken | 250/492.2 |
| 5,998,798 | A * | 12/1999 | Halling et al. | 250/492.21 |
| 6,608,316 | B1 | 8/2003 | Harrison | |
| 7,199,383 | B2 * | 4/2007 | Chen et al. | 250/492.21 |

* cited by examiner

*Primary Examiner*—Nikita Wells
(74) *Attorney, Agent, or Firm*—J.C. Patents

(57) ABSTRACT

An ion beam blocking component suitable for blocking an ion beam generated by an ion source of an ion implanter is provided. The blocking component includes a front plate, a back plate, and a plurality of side plates. The front plate has at least one opening. The back plate is behind the front plate, and has a plurality of grooves formed on one surface thereof facing the front plate. The side plates are connected between the front plate and the back plate, and a receiving space is formed between these plates.

16 Claims, 4 Drawing Sheets

ION BEAM BLOCKING COMPONENT AND ION BEAM BLOCKING DEVICE HAVING THE SAME

BACKGROUND OF THE INVENTION

1. Field of the Invention

The present invention relates to an ion beam blocking component and an ion beam blocking device having the same suitable for an ion implanter. More particularly, the present invention relates to an ion beam blocking component and an ion beam blocking device having the same both with a receiving space to collect particles generated when an ion beam impinges on an ion beam blocking component.

2. Description of Related Art

With the development of semiconductor technology, in a semiconductor manufacturing process, different specific impurities are added into a certain part or a certain film layer, and such a step is called doping and the added impurities are called dopants. Currently, the conventional doping methods can be substantially classified into a diffusion method and an ion implantation method. The diffusion method is usually called a thermal diffusion method since the impurities are self-diffused from a high concentration region to a low concentration region in a host material at high temperature (usually 800° C. or so), thereby achieving the doping purpose. With regard to the ion implantation method, the impurities are dissociated into ions firstly, and after acceleration and selection, specific ions are directly impinged into the host material, so as to achieve the doping purpose.

A common ion implanter mainly includes an ion source, an analyzer, a Faraday flag, an electron shower, and a wafer disk assembly. The ion source is used to provide ions to be implanted, and the ions include different chemical elements and pass through a magnetic field in the analyzer. The analyzer selects some ions to impinge the wafer according to a generated mass to charge ratio of the ions, so as to perform ion implantation. The Faraday flag is a monitor element used to measure and prepare before the implant of ions. The Faraday flag is usually made of graphite. Before the ion implantation, the Faraday flag is used to block an ion stream. On the contrary, when the ions are being implanted, the Faraday flag is moved to allow the ions to impinge on the wafer. When at a closed position, the Faraday flag blocks the ion beam, thereby causing a secondary electron emission. Since the secondary electrons may cause an error in measuring an ion beam current, a magnet is attached on the Faraday flag, so as to prevent the secondary electrons from flowing out. The electron shower is used to neutralize charges of the wafer. The wafer disk assembly is used to fix the wafer and scan the wafer by the use of the ion beam.

U.S. Pat. No. 5,998,798 discloses "ion dosage measurement apparatus for an ion beam implanter and method." In the ion implanter, a movable restriction plate is attached to one end of the Faraday flag, and a gap exists between the Faraday flag and the restriction plate. The restriction plate is moved relative to the Faraday flag to adjust the quantity of the ion beams passed. However, since the restriction plate is a sheet-like structure, the particles impinged on the restriction plate will contaminate a traveling path of the ion beam and a chamber where the wafer is placed, thus degrading the yield of products.

SUMMARY OF THE INVENTION

The present invention is directed to an ion beam blocking component, which is suitable for an ion implanter to block an ion beam generated by an ion source of the ion implanter. The ion beam blocking component has a receiving space to collect particles generated when an ion beam impinges on the ion beam blocking component. Therefore, the problem of the conventional art that since an ion beam blocking plate is sheet-like, the particles generated when the ion beam impinges on the ion beam blocking plate contaminate the chamber where the wafer is placed in, thus degrading the yield of products can be eliminated.

The present invention is further directed to an ion beam blocking device, which includes a plurality of ion beam blocking components connected with each other. The ion beam blocking components are rotated with an axle center as a rotating shaft. As such, when one of the ion beam blocking components cannot be used any longer, another ion beam blocking component can be rotated at any moment to block an ion beam generated by the ion source of the ion implanter.

The ion beam blocking component provided by the present invention is suitable for an ion implanter to block an ion beam generated by an ion source of the ion implanter. The blocking element includes a front plate, a back plate, and a plurality of side plates. The front plate has an at least one opening. The back plate has a plurality of grooves formed on one surface thereof facing the front plate. The side plates are connected between the front plate and the back plate, and a receiving space is formed between these plates.

In an embodiment of the present invention, the grooves on the back plate are arranged in a horizontal direction.

In an embodiment of the present invention, a plurality of grooves is formed on one surface of the front plate facing the ion beam.

In an embodiment of the present invention, the grooves on the front plate are arranged in a horizontal direction.

In an embodiment of the present invention, the depth of each of the grooves back plate is larger than the depth of each of the grooves of the front plate.

In an embodiment of the present invention, the surface with the grooves of the back plate is a rough surface.

In an embodiment of the present invention, the surface with the grooves of the back plate is a rough surface.

In an embodiment of the present invention, the front plate is made of a high-adhesive material.

In an embodiment of the present invention, the material of the front plate includes graphite or metal coated with graphite.

In an embodiment of the present invention, the back plate is made of a high hardness material.

In an embodiment of the present invention, the material of the back plate includes graphite or metal coated with graphite.

In an embodiment of the present invention, the front plate and the side plates are integrally formed.

In an embodiment of the present invention, the front plate and the side plates are fixed on the back plate by means of locking or adhering.

The ion beam blocking device provided by the present invention is suitable for an ion implanter to block an ion beam generated by an ion source of an ion implanter. The blocking device includes a plurality of ion beam blocking components. These ion beam blocking components are connected to an axle, and rotate around the axle.

In an embodiment of the present invention, these ion beam blocking components form a polyhedron structure around the axle.

In an embodiment of the present invention, these ion beam blocking components form a roulette-shape device with an axle.

In view of the above, the ion beam blocking component provided by the present invention is composed of a front plate, a back plate, and a plurality of side plates. A receiving space is formed between the front plate, the back plate, and the side plates, so as to collect the particles generated when the ion beam impinges on the back plate. In this way, the particles peeled from the back plate fall in the receiving space without contaminating the traveling path of the ion beam or the wafer under ion implantation, thereby improving the yield of products. Furthermore, a plurality of grooves is formed on the surfaces of the front plate and the back plate in a horizontal direction, so as to increase the surface area of the ion beam blocking components, thereby preventing the peeling phenomenon.

Furthermore, the present invention further provides an ion beam blocking device integrating a plurality of ion beam blocking components to form a polyhedron structure or a roulette-shape structure which can be rotated with an axle center as a rotating shaft. As such, when one of the ion beam blocking components cannot be used any longer, another ion beam blocking component can be rotated to block the bombard of the ion beam, so as to save time of replacing the ion beam blocking component.

In order to the make aforementioned and other objects, features and advantages of the present invention comprehensible, a preferred embodiment accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
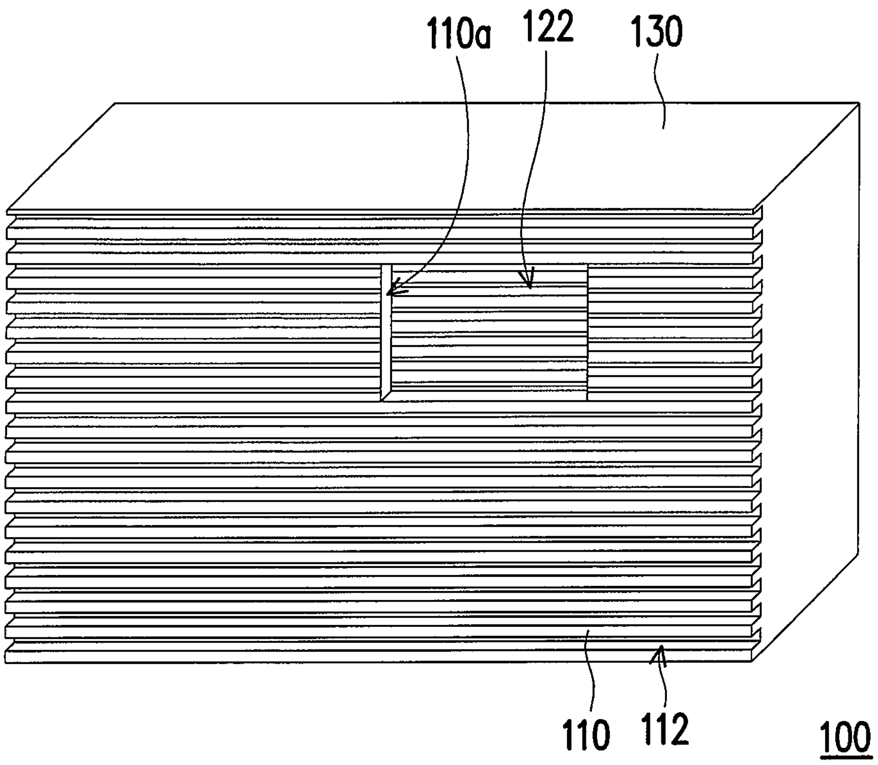
FIG. 1A is a schematic view of the appearance of an ion beam blocking component according to an embodiment of the present invention.
Figure 1B:
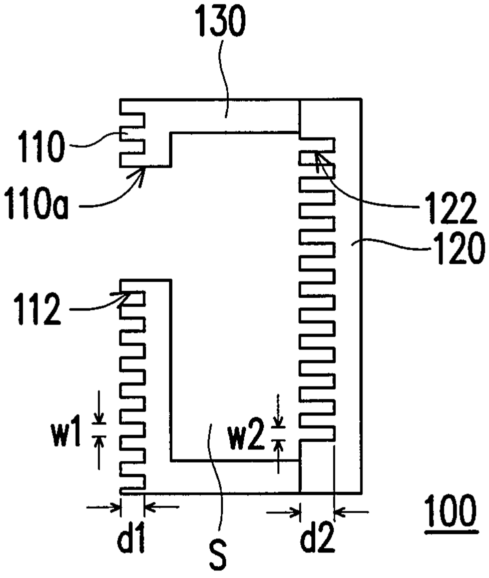
FIG. 1B is a schematic cross-sectional view of the ion beam blocking component in FIG. 1A.

FIG. 1A is a schematic view of the appearance of an ion beam blocking component according to an embodiment of the present invention, and FIG. 1B is a schematic cross-sectional view of the ion beam blocking component shown in FIG. 1A. Referring to FIGS. 1A and 1B, the ion beam blocking component 100 provided by the present invention is suitable for an ion implanter, so as to be applied in a Faraday flag or serve as an ion beam blocking plate. When the ion implanter is in a calibration mode, an ion beam generated by an ion source of the ion implanter may be blocked by the ion beam blocking component 100. The ion beam blocking component 100 mainly includes a front plate 110, a back plate 120, and a plurality of side plates 130. The structures of the elements and the connection relation therebetween will be described in accompanying with the drawings below.

The front plate 110 has at least one opening 110*a*, such that the ion beam can pass through the opening 110*a* to impinge on the back plate 120. In this embodiment, for example, a single opening 110*a* is formed on the front plate 110. However, a plurality of openings 110*a* can also be formed on the front plate 110 upon different requirements of users, as long as the openings 110*a* are at the same level, so as to prevent the falling particles dropping off through other openings 110*a*.

Furthermore, a plurality of the first grooves 112 may be selectively formed on one surface of the front plate 110 facing the ion beam, and the first grooves 112 are arranged in a horizontal direction, so as to increase the surface area of the front plate 110. In addition, the front plate 110 is made of a high-adhesive material, such as graphite, metal coated with graphite, or other suitable material. In this way, when the ion beam impinges on the front plate 110, the particles generated when the front plate 110 is bombarded will not peel easily. If the particles are peeled, the peeled particles can also be collected by the first grooves 112 extending along the horizontal direction, so as not to contaminate the traveling path of the ion beam or other components in the implanter.

The back plate 120 is behind the front plate 110, and a plurality of second grooves 122 is formed on one surface of the back plate 120 facing the front plate 110, and the second grooves 122 are also arranged in a horizontal direction. The second grooves 122 are also designed to increase the surface area of the ion beam blocking component 100, such that more particles attached thereon. Thus, the peeling can be avoided and the service life can be extended without the need of frequently replacing the ion beam blocking component 100. Furthermore, the surface with the first grooves 112 of the front plate 110 may be fabricated into a rough surface to increase the surface area, such that more particles can be attached and the peeling phenomenon can be avoided. In a similar way, the surface with the second grooves 122 of the back plate 120 can also be fabricated into a rough surface to increase the surface area.

In an embodiment of the present invention, the back plate 120 is made of a high hardness material, such as graphite, metal coated with graphite, or other suitable material, so as to resist the bombard of the ion beam. Furthermore, from FIG. 1B, it can be known that the width w2 of the second grooves 122 on the back plate 120 is the same as the width w1 of the first grooves 112, and the depth d2 of the second grooves 122 is larger than the depth d1 of the first grooves 112. In practical operation, since the ion beam directly pass through the opening 110*a* of the front plate 110 to impinge on the back plate 120, the second grooves 122 formed on the back plate 120 have a deeper depth d2, such that the particles peeled after the back plate 120 is bombarded may fall in the second grooves 122 or a receiving space S, so as not to drop out of the ion beam blocking component 100.

The side plates 130 are connected between the front plate 110 and the back plate 120, so as to form the receiving space S between the front plate 110, the back plate 120, and the side plates 130. In an embodiment of the present invention, the front plate 110 and the side plates 130 connected around the front plate 110 are integrally formed, and the front plate 110 and the side plates 130 can be fixed on the back plate 120 by means of adhering, locking, or others.

When the ion implanter is in the calibration mode, the ion beam generated by the ion source of the ion implanter will pass through the opening 110*a* of the front plate 110 to impinge on the back plate 120. In this way, the particles generated after the back plate 120 is bombarded by the ion beam will fall in the second grooves 122 or the receiving space S, so as not to contaminate the traveling path of the ion beam or a wafer under the ion implantation.

Figure 2:
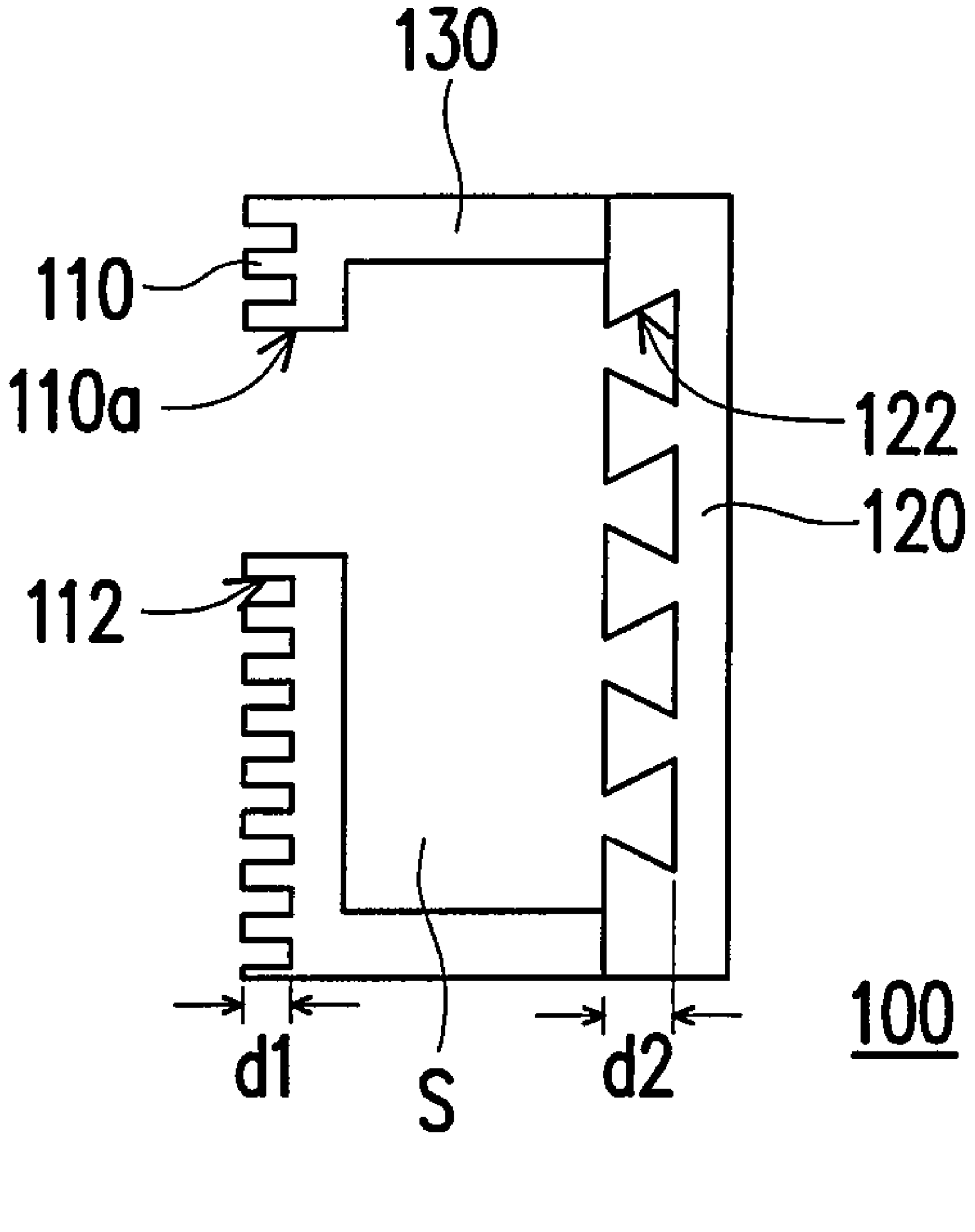
FIG. 2 is a schematic cross-sectional view of an ion beam blocking component according to another embodiment of the present invention.

Referring to FIG. 2, in another embodiment of the present invention, the second grooves 122 formed on the back plate 120 have a trapezoidal section, and the width of the bottom of each of the second grooves 122 is larger than the width of the opening, such that the particles cannot be dropped out easily.

Figure 3:
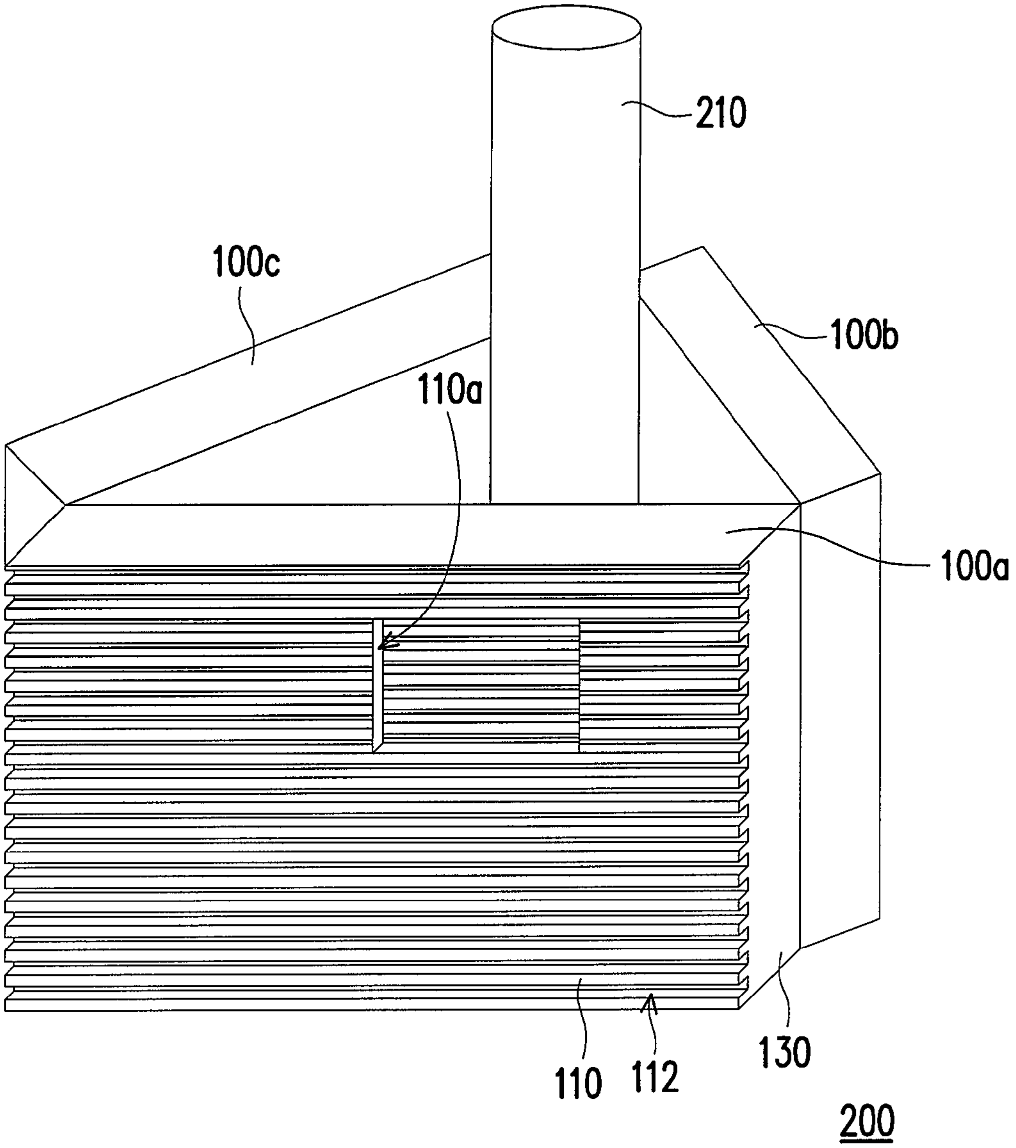
FIG. 3 is a schematic view of the appearance of an ion beam blocking component according to another embodiment of the present invention.

FIG. 3 is a schematic view of the appearance of the ion beam blocking device of the present invention. The ion beam blocking device 200 is also suitable for an ion implanter to be applied in a Faraday flag or serve as a common ion beam blocking plate. Referring to FIG. 3, the ion beam blocking device 200 includes a plurality of ion beam blocking components, such as the ion beam blocking components 100*a*, 100*b*, and 100*c*, as shown in the FIG. 1A. The ion beam blocking components 100*a*, 100*b*, and 100*c* are connected with each other to form a polyhedron structure which is rotated with an axle center 210 as a rotating shaft.

In this way, when the ion beam blocking component 100*a* cannot be used any longer, another ion beam blocking component 100*b* can be rotated to block the bombard of the ion beam, thereby saving the time of replacing the ion beam blocking component 100. In this embodiment, the three ion beam blocking components 100*a*, 100*b*, and 100*c* are described as an example. However, more ion beam blocking components 100 shown in FIG. 1 can be combined together. In the present invention, the number of the ion beam blocking components 100 in the ion beam blocking device 200 is not limited.

Figure 4:
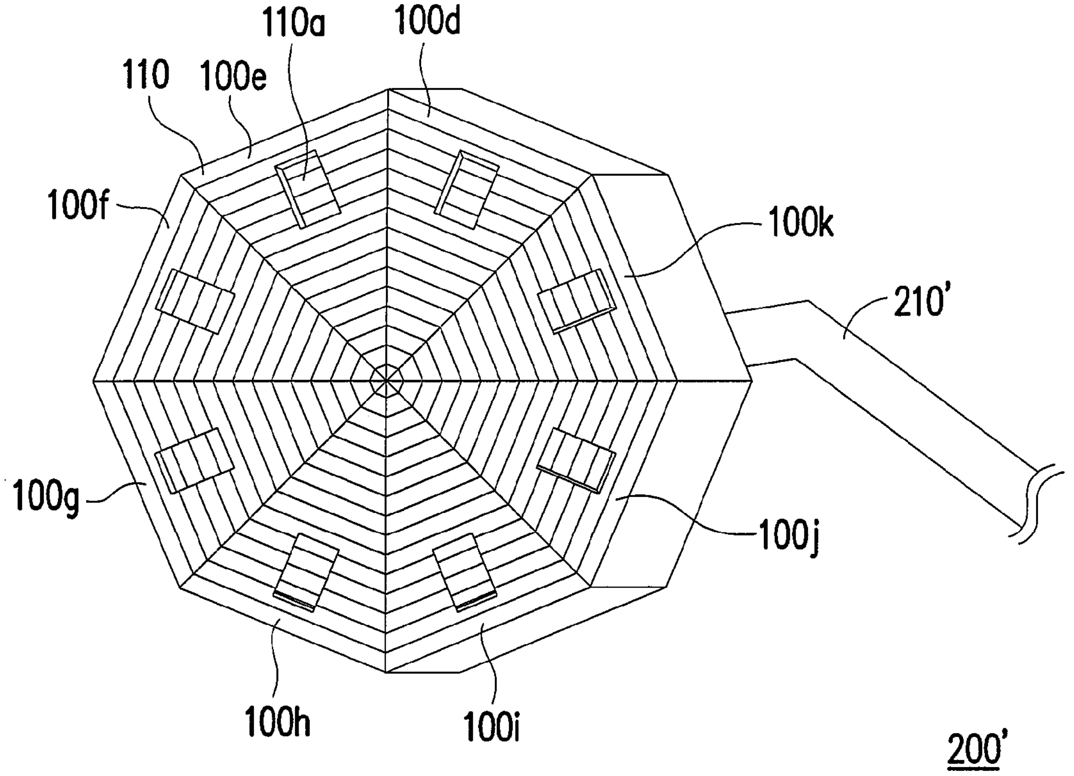
FIG. 4 is a schematic view of the appearance of an ion beam blocking component according to another embodiment of the present invention.

Except the ion beam blocking device having the polyhedron structure as shown in FIG. 3, the present invention also provides a roulette-shaped ion beam blocking device 200' shown in FIG. 4. Referring to FIG. 4, the ion beam blocking device 200' comprises a plurality of ion beam blocking components 100*d*, 100*e*, 100*f*, 100*g*, 100*h*, 100*i*, 100*j*, 100*k* arranged in a roulette-shaped structure. These ion beam components 100*d*, 100*e*, 100*f*, 100*g*, 100*h*, 100*i*, 100*j*, 100*k* are connected to an axle center, and are rotated with an axle center 210' as a rotating shaft. Preferably, when each ion beam component 100*d*-100*e*-100*f*-100*g*-100*h*-100*i*-100*j*-100*k* is operated, the plurality of the first grooves 112 on of the front plate 110 is kept horizontal when facing the ion beam. Similarly, when the ion beam blocking component 100*d* cannot be used any longer, another ion beam blocking component 100*e* can be rotated to block the bombard of ion beam, thereby saving the time of replacing the ion beam blocking component 100. The number of the ion beam blocking component 100 of the ion beam blocking device 200' is not limited in the present invention.

In view of the above, the ion beam blocking component provided by the present invention has a receiving space formed by the front plate, the back plate, and the plurality of side plate. When the ion implanter is in the calibration mode, the ion beam generated by the ion source of the ion implanter will pass through the opening of the front plate to impinge on the back plate. In this way, the particles generated after the back plate is bombarded by the ion beam will fall in the receiving space, so as not to contaminate the traveling path of the ion beam or a wafer under ion implantation, thereby improving the yield of products. Furthermore, a plurality of grooves arranged in a horizontal direction are formed on the surfaces of the front plate and the back plate, so as to increase the surface area of the ion beam blocking component and further avoid the peeling phenomenon.

Furthermore, the present invention further provides an ion beam blocking device integrating a plurality of ion beam blocking components to form a polyhedron structure or a roulette-shape structure which can be rotated with an axle center as a rotating shaft. As such, when one of the ion beam blocking components cannot be used any longer, another ion beam blocking component can be rotated to block the bombard of the ion beam, so as to save time of replacing the ion beam blocking component.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An ion beam blocking component, suitable for an ion implanter to block an ion beam generated by an ion source of the ion implanter, the ion beam blocking component comprising:

a front plate, wherein the front plate has at least one opening;

a back plate, comprising a plurality of grooves formed on one surface of the back plate facing the front plate; and a plurality of side plates, connected between the front plate and the back plate, wherein a receiving space is formed between the front plate, the back plate, and the side plates.

2. The ion beam blocking component as claimed in claim 1, wherein the grooves on the back plate are arranged in a horizontal direction.

3. The ion beam blocking component as claimed in claim 1, wherein a plurality of grooves is formed on one surface of the front plate facing the ion beam.

4. The ion beam blocking component as claimed in claim 3, wherein the grooves on the front plate are arranged in a horizontal direction.

5. The ion beam blocking component as claimed in claim 3, wherein a depth of each of grooves on the back plate is larger than a depth of each of the grooves on the front plate.

6. The ion beam blocking component as claimed in claim 3, wherein the surfaces with the grooves of the back plate and the front plate are rough surfaces.

7. The ion beam blocking component as claimed in claim 1, wherein the surfaces with the grooves of the back plate and the front plate are rough surfaces.

8. The ion beam blocking component as claimed in claim 1, wherein the front plate is made of a high-adhesive material.

9. The ion beam blocking component as claimed in claim 8, wherein the material of the front plate comprises graphite, or metal coated with graphite.

10. The ion beam blocking component as claimed in claim 1, wherein the back plate is made of a high hardness material.

11. The ion beam blocking component as claimed in claim 10, wherein the material of the back plate comprises graphite, or metal coated with graphite.

12. The ion beam blocking component as claimed in claim 1, wherein the front plate and the side plates are integrally formed.

13. The ion beam blocking component as claimed in claim 12, wherein the front plate and the side plates are fixed on the back plate by locking or adhering.

14. An ion beam blocking device, suitable for an ion implanter to block an ion beam generated by an ion source of the ion implanter, wherein the ion beam blocking device comprises a plurality of ion beam blocking components as claimed in claim 1, connected to an axle and rotating with the axle.

15. The ion beam blocking device as claimed in claim 14, wherein the ion beam blocking components form a polyhedron structure around the axle.

16. The ion beam blocking device as claimed in claim 14, wherein the ion beam blocking components are arranged in a roulette-shape structure with an axle, and rotate around the axle.

* * * * *